United States Patent
Tian et al.

(10) Patent No.: US 9,664,572 B2
(45) Date of Patent: May 30, 2017

(54) THIN FILMS HAVING LARGE TEMPERATURE COEFFICIENT OF RESISTANCE AND METHODS OF FABRICATING SAME

(71) Applicant: Seagate Technology LLC, Cupertino, CA (US)

(72) Inventors: Wei Tian, Eden Prairie, MN (US); Declan Macken, Prior Lake, MN (US); Huaqing Yin, Eden Prairie, MN (US); Venkateswara Rao Inturi, Shakopee, MN (US); Eric Walter Singleton, Maple Plain, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 1017 days.

(21) Appl. No.: 13/687,445

(22) Filed: Nov. 28, 2012

(65) Prior Publication Data
US 2014/0146856 A1    May 29, 2014

(51) Int. Cl.
*G01K 7/22* (2006.01)
*G01K 7/16* (2006.01)
(Continued)

(52) U.S. Cl.
CPC .......... *G01K 7/16* (2013.01); *C23C 14/06* (2013.01); *G11B 5/607* (2013.01); *H01C 7/006* (2013.01);
(Continued)

(58) Field of Classification Search
None
See application file for complete search history.

(56) References Cited

U.S. PATENT DOCUMENTS 6,556,390 B1 * 4/2003 Mao .................. B82Y 10/00
                                                   360/324.1
7,833,800 B2   11/2010 Bell et al.
(Continued)

FOREIGN PATENT DOCUMENTS

JP    06295404    10/1994
JP    07006309     1/1995
(Continued)

OTHER PUBLICATIONS

Egelhoff et al., "Specular Electron Scattering in Giant Magnetoresistance Spin Valves", IEEE Transactions on Magnetics, vol. 33, No. 5, Sep. 1997, pp. 3580-3582.
(Continued)

*Primary Examiner* — Lisa Caputo
*Assistant Examiner* — Nasir U Ahmed
(74) *Attorney, Agent, or Firm* — Hollingsworth Davis, LLC

(57) ABSTRACT

An apparatus comprises a head transducer and a resistive temperature sensor provided on the head transducer. The resistive temperature sensor comprises a first layer comprising a conductive material and having a temperature coefficient of resistance (TCR) and a second layer comprising at least one of a specular layer and a seed layer. A method is disclosed to fabricate such sensor with a laminated thin film structure to achieve a large TCR. The thicknesses of various layers in the laminated thin film are in the range of few to a few tens of nanometers. The combinations of the deliberately optimized multilayer thin film structures and the fabrication of such films at the elevated temperatures are disclosed to obtain the large TCR.

25 Claims, 10 Drawing Sheets

(51) Int. Cl.
*C23C 14/06* (2006.01)
*H01C 7/00* (2006.01)
*H01C 7/02* (2006.01)
*G11B 5/60* (2006.01)
*H01C 7/06* (2006.01)

(52) U.S. Cl.
CPC ............. *H01C 7/008* (2013.01); *H01C 7/021* (2013.01); *H01C 7/06* (2013.01)

(56) References Cited

U.S. PATENT DOCUMENTS

| | | | | |
|---|---|---|---|---|
| 8,765,273 | B1* | 7/2014 | Kubota | G11B 5/66 360/59 |
| 2004/0246620 | A1* | 12/2004 | Sasaki | B82Y 10/00 360/125.5 |
| 2007/0019325 | A1* | 1/2007 | Shimizu | G11B 5/3133 360/125.74 |
| 2008/0094168 | A1 | 4/2008 | Hynes et al. | |
| 2012/0008230 | A1 | 1/2012 | Nishioka et al. | |
| 2013/0170070 | A1* | 7/2013 | Das | G11B 5/6076 360/75 |

FOREIGN PATENT DOCUMENTS

| | | |
|---|---|---|
| JP | 08017156 | 1/1996 |
| JP | 2002280634 | 9/2002 |
| JP | 2003123204 | 4/2003 |
| JP | 2004531017 | 10/2004 |
| JP | 2006228332 | 8/2006 |

OTHER PUBLICATIONS

Kawawake et al., "Enhancement of MR Ratios with Ag Capping Layer in (100) Oriented Ni—Fe/Cu/Co Trilayers", IEEE Transactions on Magnetics, vol. 33, No. 5, Sep. 1997, pp. 3538-3540.

Yamada et al., "In-Situ Conductance Measurement of Surface Specularity of NiFe, Co, Cu, Ag and Ta Thin Films", IEEE Transactions on Magnetics, vol. 35, No. 5, Sep. 1999, pp. 2979-2981.

Office Action dated Feb. 10, 2015 from Japanese Application No. 2013-244830, 3 pages.

Office Action dated Feb. 11, 2015 from Korean Application No. 10-2013-0145510, 5 pages.

Dimmich, "Electrical Conductance and Temperature Coefficient of Resistivity of Double-Layer Films", Thin Solid Films, vol. 158, 1988, pp. 13-24.

Office Action dated Nov. 17, 2015 from Japanese Application No. 2013-244830, 3 pages.

Office Action dated Oct. 29, 2015 from Korean Application No. 10-2013-0145510, 6 pages.

Office Action dated Nov. 17, 2015 from Japanese Application No. 2013-244830, 4 pages.

Office Action dated Sep. 29, 2016 from Chinese Application No. 201310613275.8, 6 pages.

* cited by examiner

| TABLE 1 | |
|---|---|
| Materials | Sheet Resistance (ohms) |
| Ni | 5.02 |
| Ta/Ni/Ta | 4.53 |
| Ru/Ni/Ru | 4.02 |
| Pt/Ni/Pt | 3.57 |

*TABLE 2*

| Materials | Sheet Resistance (ohms) |
|---|---|
| NiFe4 | 5.76 |
| Ta/NiFe4/Ta | 5.38 |
| Ru/NiFe4/Ru | 5.07 |

THIN FILMS HAVING LARGE TEMPERATURE COEFFICIENT OF RESISTANCE AND METHODS OF FABRICATING SAME

SUMMARY

Embodiments of the disclosure are directed to apparatuses comprising a head transducer and a resistive temperature sensor provided on the head transducer. Embodiments of the disclosure are directed to fabricating a resistive temperature sensor, such as a resistive temperature sensor for use on a head transducer. Embodiments are directed to methods and apparatuses for fabricating a resistive temperature sensor with a large temperature coefficient resistance (TCR).

According to various embodiments, apparatuses of the disclosure comprise a head transducer and a resistive temperature sensor provided on the head transducer. The resistive temperature sensor comprises a first layer comprising a conductive material and having a TCR and a second layer comprising at least one of a specular layer and a seed layer. According to some embodiments, the first layer has a thickness approximately equal to or less than a mean-free-path of an electron in the conductive material of the first layer.

In accordance with other embodiments, methods for fabricating a resistive temperature sensor includes forming, on a head transducer, a first layer comprising a conductive material having a TCR and forming, on the head transducer, a second layer comprising at least one of a specular layer and a seed layer. According to some embodiments, forming the first layer comprises forming the first layer to a thickness approximately equal to or less than a mean-free-path of an electron in the conductive material of the first layer.

These and other features and aspects which characterize various embodiments can be understood in view of the following detailed discussion and the accompanying drawings.

DETAILED DESCRIPTION

Metal thin films with a sufficient temperature coefficient of resistance can be used as temperature sensors. In particular, metal thin films with a sufficiently high TCR can be used to fabricate temperature sensors for detecting head-media contact and thermal asperities in hard disk drives and other magnetic recording devices. The signal noise ratio (SNR) associated with contact detection (CD) and thermal asperity (TA) detection is dependent upon the TCR of the materials used to fabricate CD and/or TA detection sensors.

To obtain a sufficiently high SNR, materials with larger TCR are generally desirable. A typical CD or TA detection sensor consists of metal thin films having thicknesses of a few tens of nanometers. In such typical detection sensors, the mean-free-path of the electrons is nearly equal to or greater than the thicknesses of the films. The TCRs of the thin film materials can, therefore, be much less than the bulk TCRs of the same materials due to excessive surface and interface scatterings. Deliberately designed materials and the fabricating methods are, thus, needed to achieve the desirable large TCRs.

Embodiments of the disclosure are directed to laminated metal and metal/oxide thin films and methods of fabricating same to achieve a large TCR for temperature sensing applications. Laminated thin film structures, according to various embodiments, preferably comprise a conductive metal layer and another layer which can either be a metal specular layer, an oxide specular layer, or a seed layer. The conductive metal layer has a TCR. The thicknesses of various layers in the laminated thin film structure are preferably in the range of few to a few tens of nanometers. Various embodiments directed to combinations of deliberately optimized multilayer thin film structures and fabrication methods of such films at elevated temperatures are disclosed herein to obtain the large TCR.

The TCR of a given material is defined by the following formula:

$$TCR = \frac{1}{R_0}\frac{dR}{dT}$$

Here, $R_0$ is the resistance at the room temperature and dR/dt denotes the resistance change as a function of the temperature. Given that the TCR is inversely proportional to $R_0$, a reduction in $R_0$ is expected to yield a larger TCR. Likewise, an increase in dR/dt leads to a larger TCR as well.

$R_0$ accounts for resistances impacted by many factors. For example, surface and interface scattering, together with structural and chemical defect scattering, add to the material resistance, $R_0$, while contributing very little to the TCR. Since dR/dt is the thermally activated resistance of the material and is in large part an intrinsic characteristic of the material, embodiments of the disclosure target the reduction of $R_0$ of the thin films to increase the TCR of temperature sensing devices, such as CD and TA detection sensors.

Figure 1:
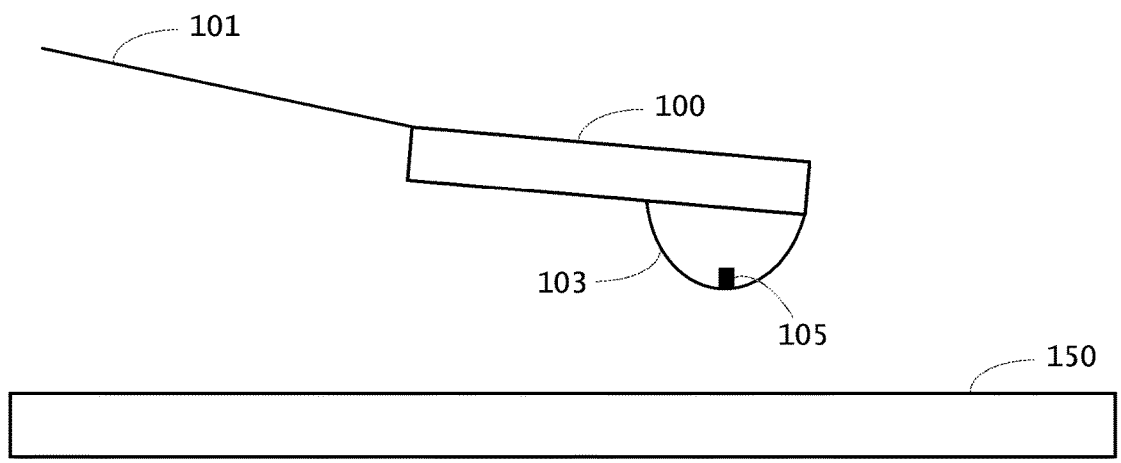
FIG. 1 shows a simplified side view of a head transducer arrangement which incorporates a resistive temperature sensor in accordance with various embodiments.

In accordance with various embodiments, and with reference to FIG. 1, a slider 100 is shown supported by a suspension 101 in close proximity to a rotating magnetic storage disk 150. The slider 100 supports a recording head transducer 103. A resistive temperature sensor 105 is shown on the head transducer 103. The resistive temperature sensor 105 may be positioned at the close point to the magnetic recording medium 150. The close point is generally understood to be the closest point of contact between the head transducer 103 and the magnetic recording medium 150. The resistive temperature sensor 105 is preferably configured to sense changes in heat flow for detecting asperities of the medium 150 and head-to-media contact.

Figure 2:
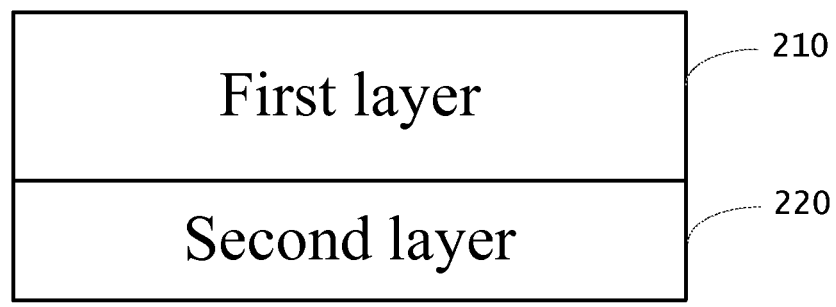
FIG. 2 shows a structure of a resistive temperature sensor in accordance with various embodiments.

Referring to FIG. 2, a structure of the resistive temperature sensor 105 shown in FIG. 1 is illustrated in accordance with various embodiments. The sensor structure illustrated in FIG. 2 includes a first layer 210 comprising a conductive material and having a TCR and a second layer 220 comprising at least one of a specular layer and a seed layer. In some embodiments, the sensor structure shown in FIG. 2 includes the first layer 210 and a second layer 220 comprising a specular layer. In other embodiments, the sensor structure illustrated in FIG. 2 includes the first layer 210 and a second layer 220 comprising a seed layer. The conductive material of the first layer 210 preferably comprises Cu, Co, Ni, Ru, Pt, Au, Fe, or $Ni_xFe_{1-x}$, or their alloys. The first layer 210 preferably has a thickness approximately equal to or less than a mean-free-path of an electron in the conductive material of the first layer 210.

Figure 3:
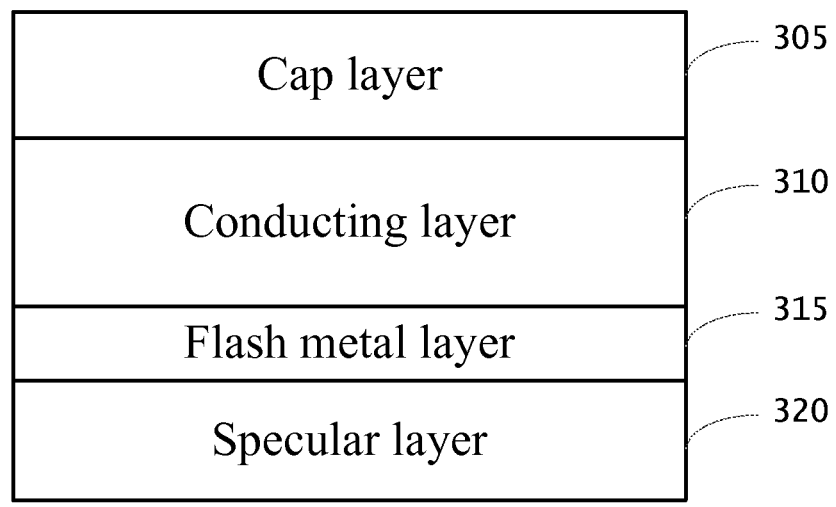
FIGS. 3-6 show structures of a resistive temperature sensor in accordance with other embodiments.

FIG. 3 shows a detailed structure of the resistive temperature sensor 105 shown in FIG. 1 in accordance with various embodiments. According to embodiments consistent with FIG. 3, a first layer of the resistive temperature sensor comprises a conducting layer 310 having a conductive material and a TCR. A second layer, shown below the conducting layer 310, comprises a specular layer 320. The resistive temperature sensor 105 comprises a cap layer 305 above the first layer 310.

The cap layer preferably comprises Ta, Ru, Cr, NiCr, or NiRu, or their alloys. The specular layer 320 is preferably made of metal or oxide thin films. In one representative embodiment, the specular layer 320 shown in FIG. 3 includes an insulator layer comprising $SiO_2$, NiO, $Al_2O_3$, $FeO_x$, $HfO_2$, $Y_2O_3$, MgO, $TiO_x$, $CuO_x$, $SrTiO_3$, or ZrO. In another representative embodiment, the specular layer 320 comprises a metal layer that includes Au, Ag, Cu, Pt, or Ru, or their alloys.

Specular effects have been observed and measured in many cases by the inventors. For example, using $SiO_2$ and NiO as the specular layer 320 in FIG. 3, the specularity factors for Ag, NiFe, Cu, and Ta were found to be approximately 0.8, 0.5, 0.4, and 0, respectively. The specular reflection layer 320 confines the electrons in the conducting layer 310 and reduces the surface and interface scattering. The resistance of the conducting layer 310, thus, is reduced. The TCR of the resulting thin film resistive temperature sensor 105, therefore, is increased by reducing the total resistance $R_0$. The specular layer 320 has a preferred specularity of about 0.2 to about 1, with a more preferred specularity of about 0.5 to about 0.8, and a further preferred specularity of about 0.8 to about 1. Perfect specular layers 320 provide specularity of 1 and completely eliminate the interface scattering. Thus, specular layers 320 with specularity of 1 are ideally desirable to provide the largest TCR gain. However, interfacial imperfection and electronic band alignment thwart the realization of specularity of 1. In practice, a specularity of about 0.5 to about 0.8 is obtainable with careful interface material and electronic band engineering, including in situ high vacuum deposition and/or oxidation.

As illustrated in FIG. 3, the sensor 105 of FIG. 1 can further comprise at least one flash metal layer 315 between the first layer 310 and the specular layer 320. A flashing of the very thin metal layer 315 between the metallic conducting layer 310 and the specular layer 320 provides for an increase in the specular effect and thus increases the TCR. The flash layer 315 preferably comprises Cu, Ag, or Au, or their alloys.

Figure 4:
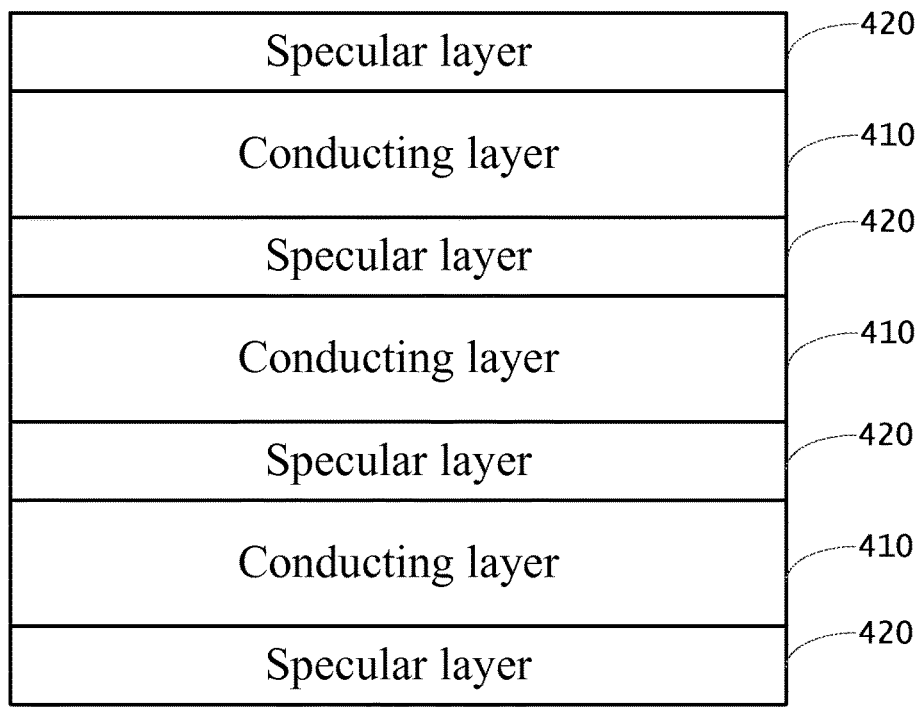
Figure 5:
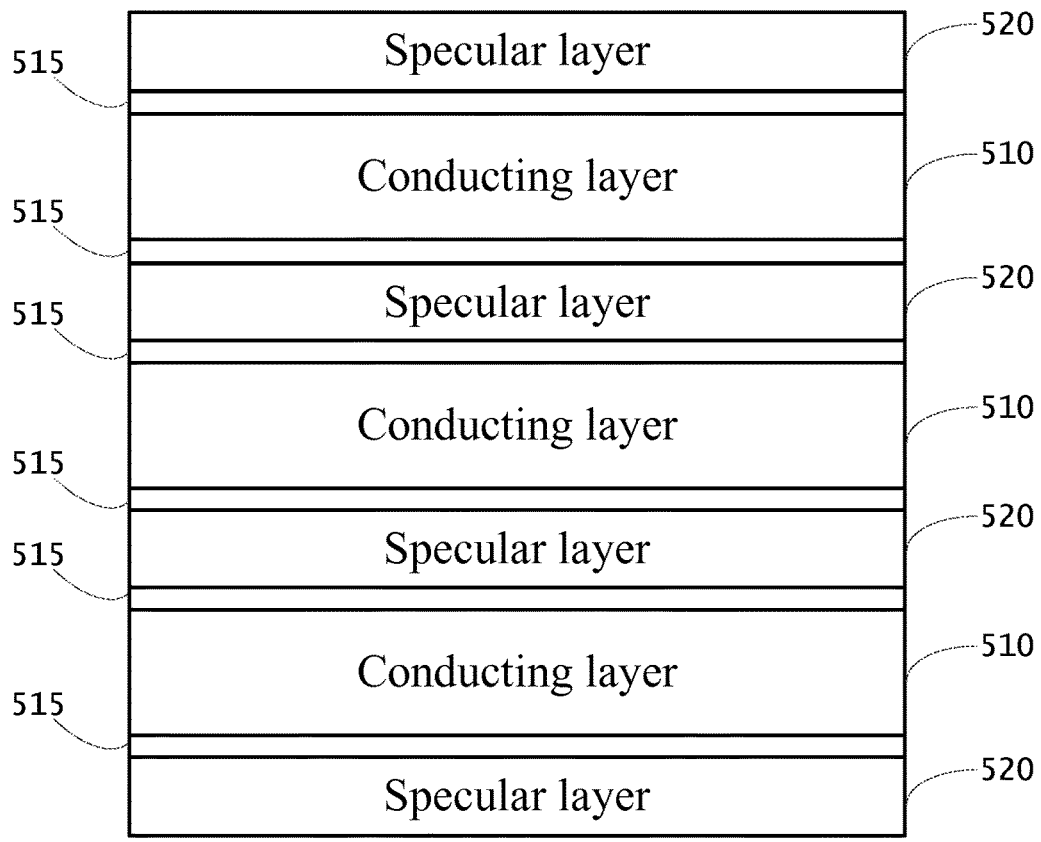

FIG. 4 shows a schematic of a laminated structure of the resistive temperature sensor 105 of FIG. 1 comprising a plurality of first conducting layers 410 and a plurality of specular layers 420 adjacent to the conducting layers 410 in accordance with various embodiments. FIG. 5 shows a schematic of a laminated structure of the resistive temperature sensor 105 of FIG. 1 comprising a plurality of the conducting layers 510, a plurality of the specular layers 520 adjacent to the conducting layers 510, and a plurality of flash metal layers 515 between the conducting layers 510 and the specular layers 520 in accordance with other embodiments. The individual layer thicknesses are preferably in the range of a few angstroms or a few tens of nanometers. The thicknesses of the conducting layers 510 range from about 5 to about 100 nm, with preferred thicknesses ranging from about 5 to about 30 nm. The thicknesses of the specular layers 520 range from about 1 to about 20 nm, with preferred thicknesses ranging from about 2 to about 5 nm. The thicknesses of the flash metal layers 515 range from about 0.5 to about 5 nm, with preferred thicknesses raging from about 0.5 to about 2 nm. The fabrication of the specular reflection layers include sputtering, CVD, MOCVD, IBD, MBE, e-beam evaporation, natural, plasma and reticle oxidation.

Figure 6:
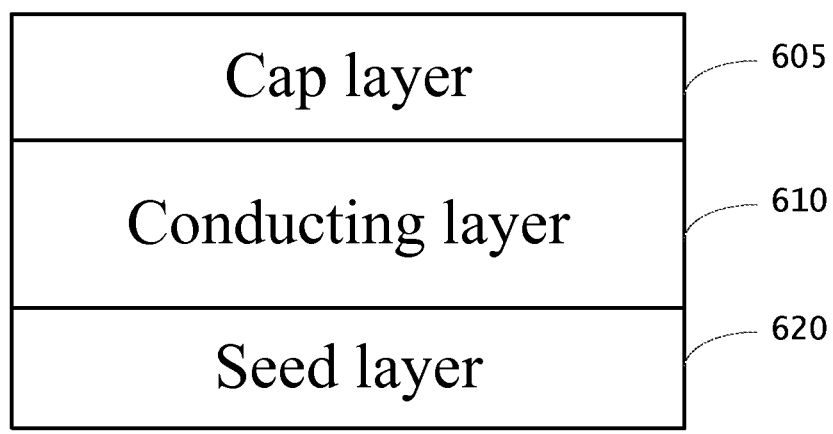

According to various embodiments, another representative structure of the resistive temperature sensor 105 of FIG. 1 is shown in FIG. 6. The structure in FIG. 6 comprises a conducting layer 610 as a first layer, and a seed layer 620 as a second layer. The seed layer 620 is shown below the conducting layer 610. The seed layer 620 preferably comprises Ta, Ru, Cr, NiCr, or NiRu, or their alloys. The resistive temperature sensor 105 illustrated in FIG. 6 further comprises a cap layer 605 shown above the conducting layer 610. A seeding effect of the seed layer 620 provides for a reduction in the sheet resistance $R_0$ of the thin film resistive temperature sensor 105 as a means to increase the TCR of the sensor 105. Based on the same structure shown in FIG. 6, the cap layer 605 and the seed layer 620 can (individually or in combination) also provide a specular effect. The cap and seed layers 605 and 620 can thus serve as specular layers.

Figure 7:
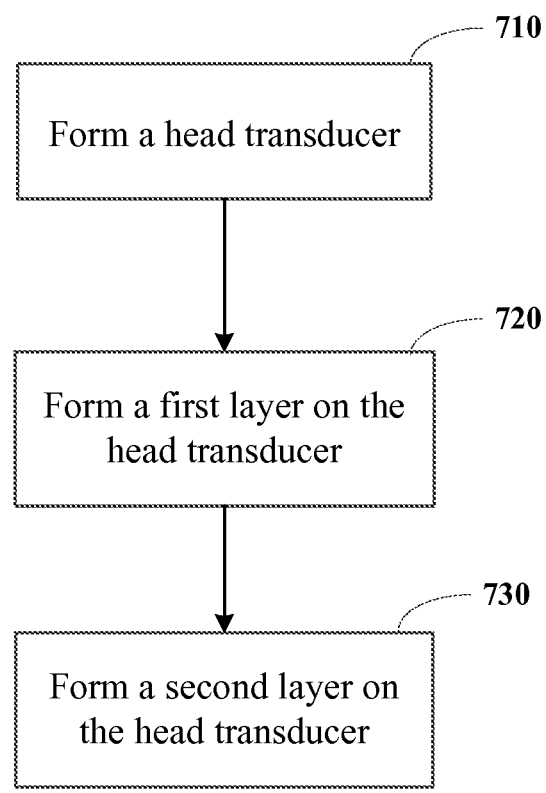
FIG. 7 illustrates various processes for fabricating a resistive temperature sensor in accordance with various embodiments.

FIG. 7 illustrates various processes for fabricating a resistive temperature sensor in accordance with various embodiments. The methodology illustrated in FIG. 7 involves forming 710 a head transducer and forming 720, on the head transducer, a first layer comprising a conductive material having a TCR. The first layer is formed to a thickness approximately equal to or less than a mean-free-path of an electron in the conductive material of the first layer. The conductive material preferably comprises Cu, Co, Ni, Ru, Pt, Au, Fe, or $Ni_xFe_{1-x}$, or their alloys. The methodology shown in FIG. 7 further involves forming 730, on the head transducer, a second layer comprising at least one of a specular layer and a seed layer. In some embodiments, the methodology illustrated in FIG. 7 further involves forming 730, on the head transducer, the second layer comprising a specular layer. In other embodiments, the methodology shown in FIG. 7 further involves forming 730, on the head transducer, the second layer comprising a seed layer.

Figure 8:
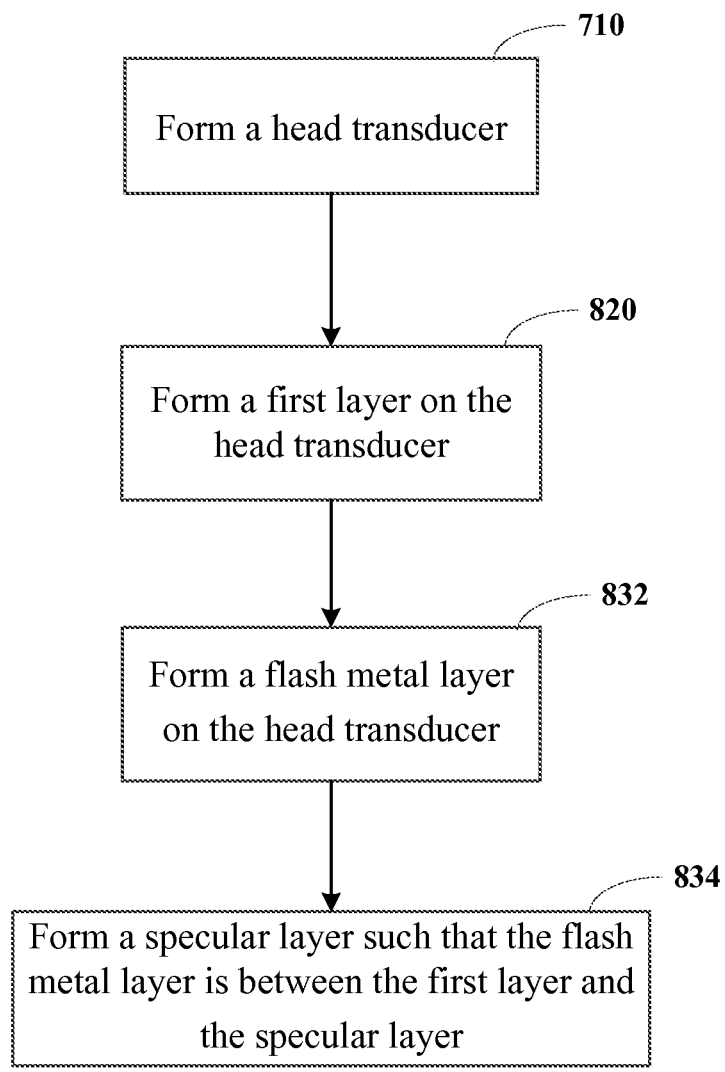
FIGS. 8-9 illustrate various processes for fabricating a resistive temperature sensor in accordance with other embodiments.

FIG. 8 shows various processes for fabricating a resistive temperature sensor in accordance with other embodiments.

According to the embodiment shown in FIG. 8, a head transducer is formed 710, and a first layer comprising a conductive material having a TCR is formed 820 on the formed head transducer. The method in FIG. 8 further comprises forming 832, on the head transducer, a flash metal layer. The flash metal layer preferably comprises a flash material comprising Cu, Ag, or Au, or their alloys. The method illustrated in FIG. 8 also comprises forming 834 a specular layer such that the flash metal layer is between the first layer and the specular layer. The specular layer can comprise $SiO_2$, NiO, $Al_2O_3$, $FeO_X$, $HfO_2$, $Y_2O_3$, MgO, $TiO_X$, $CuO_X$, $SrTiO_3$, or ZrO. The specular layer can also comprise Au, Ag, Cu, Pt, or Ru, or their alloys. A flashing of the very thin metal layer between the metallic conducting layer and the specular layer further increases the specular effect of the specular layer and thus increases the TCR of the resistive temperature sensor.

Figure 9:
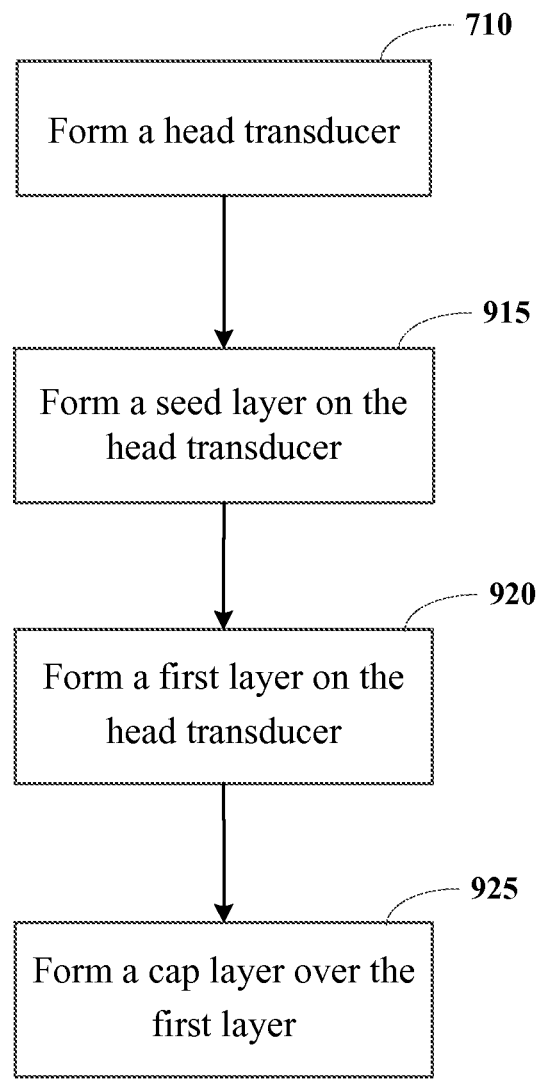

Referring to FIG. 9, there is illustrated various processes for fabricating a resistive temperature sensor in accordance with various embodiments. After forming 710 a head transducer, the method shown in FIG. 9 involves forming 915 a seed layer comprising Ta, Ru, Cr, NiCr, or NiRu, or their alloys and forming 920 a first layer on the head transducer. The first layer comprises a conducting layer having a conductive material and a TCR. The seed layer is formed below the first layer to provide a seeding effect, which reduces the sheet resistance of the thin film sensor as a means to increase the TCR of the sensor. The seed and conducting layers are formed in situ in a high vacuum environment, at an elevated temperature relative to room temperature. The method in FIG. 9 also comprises forming 925 a cap layer over the first layer. The cap layer preferably comprises Ta, Ru, Cr, NiCr, or NiRu, or their alloys.

Figures 10A, 10B:
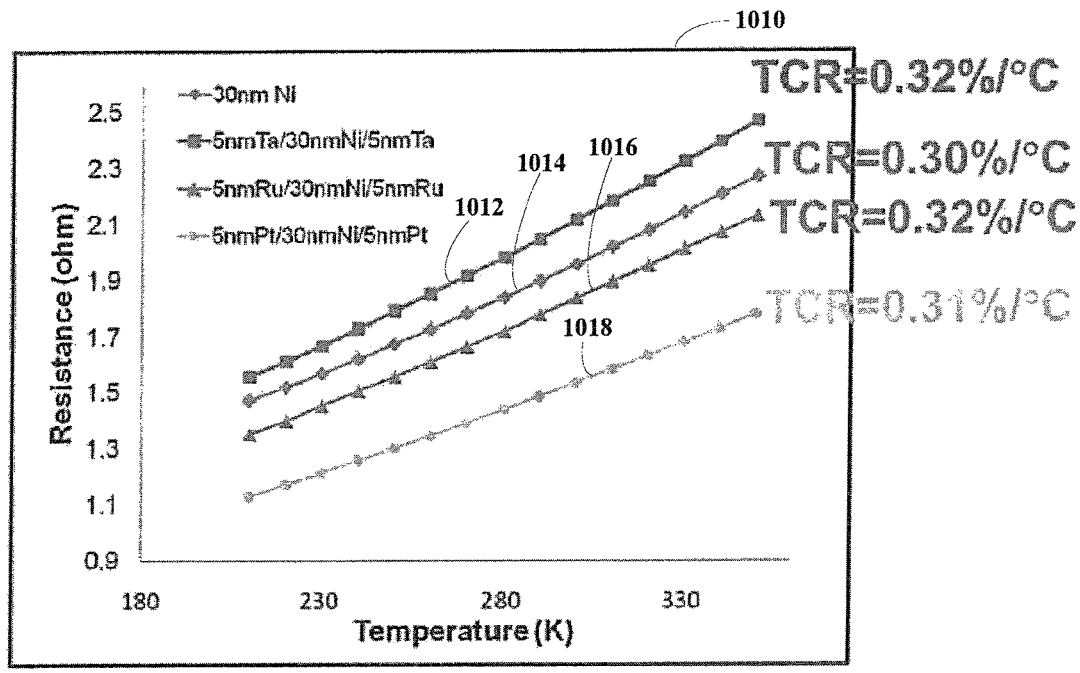
FIGS. 10A and 10B illustrate TCR data corresponding to trilayer films consisting of an Ni film as a conducting layer, and Ta, Ru or Pt thin films as specular layers or seed layers both over and underneath the Ni layer in accordance with various embodiments.

FIGS. 10A and 10B shows TCR data (shown in graphical form 1010 in FIG. 10A and data table form 1020 in FIG. 10B) corresponding to a trilayer structure illustrated in FIG. 6. The specific trilayer films shown in FIG. 10A are a Ni film (30 nm) as the conducting layer and Ta (1012) or Ru (1016) or Pt (1018) thin layers (5 nm) as both the specular layers and/or seed layers over and underneath the Ni layer. It is shown that the trilayer metal films show slightly higher TCR than the single layer Ni films (1014). The sheet film resistances 1020 of the same films shown in FIG. 10 are shown in Table 1 of FIG. 10B. It can be seen that the sheet resistances of the trilayer thin films are lower than that of the single layer Ni film.

Figures 11A, 11B:
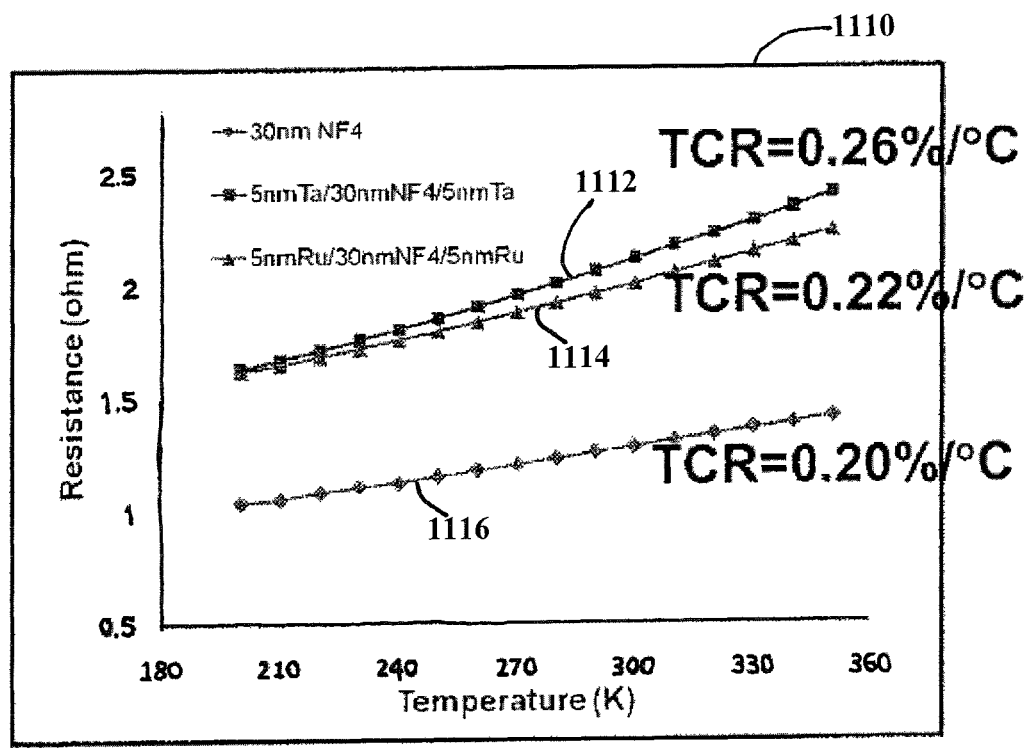
FIGS. 11A and 11B illustrate TCR data corresponding to trilayer films consisting of $Ni_{96}Fe_4$ film as a conducting layer, and Ta or Ru thin films as specular layers or seed layers both over and underneath the NiFe layer in accordance with various embodiments.

The TCR data shown in FIGS. 11A and 11B (shown in graphical form 1110 in FIG. 11A and data table form 1120 in FIG. 11B) corresponds to trilayer films consisting of $Ni_{96}Fe_4$ film (30 nm) as the conducting layer and Ta (1112) or Ru (1114) thin films (5 nm) as the specular layers and/or seed layers. The sheet resistances of the same films are shown in Table 2 of FIG. 11B. The trilayer thin films were made in situ in a high vacuum environment ($5*10^{-9}$ torr), which minimized the interfacial impurities between the different layers. TCRs of the trilayer thin films were found to be slightly larger than the single layer films. In addition, the sheet resistances 1120 shown in FIG. 11B of the trilayer thin films were found to be lower than the single layer films.

Fabrication of the multi-layer thin film structures at elevated temperatures as compared to room temperature results in larger grain size of the thin film materials, and thus a reduction in the residual resistance resulting from defect scattering. The reduction in $R_0$ is expected to enhance the TCR. Preparation of the 5 nm Ta/30 nm Ni/5 nm Ta trilayer thin films fabricated at 250° C. and 350° C. yielded a TCR of ~0.38%/° C., which compares to a TCR of ~0.32%/° C. observed in the same trilayer thin films prepared at room temperature.

Figure 12:
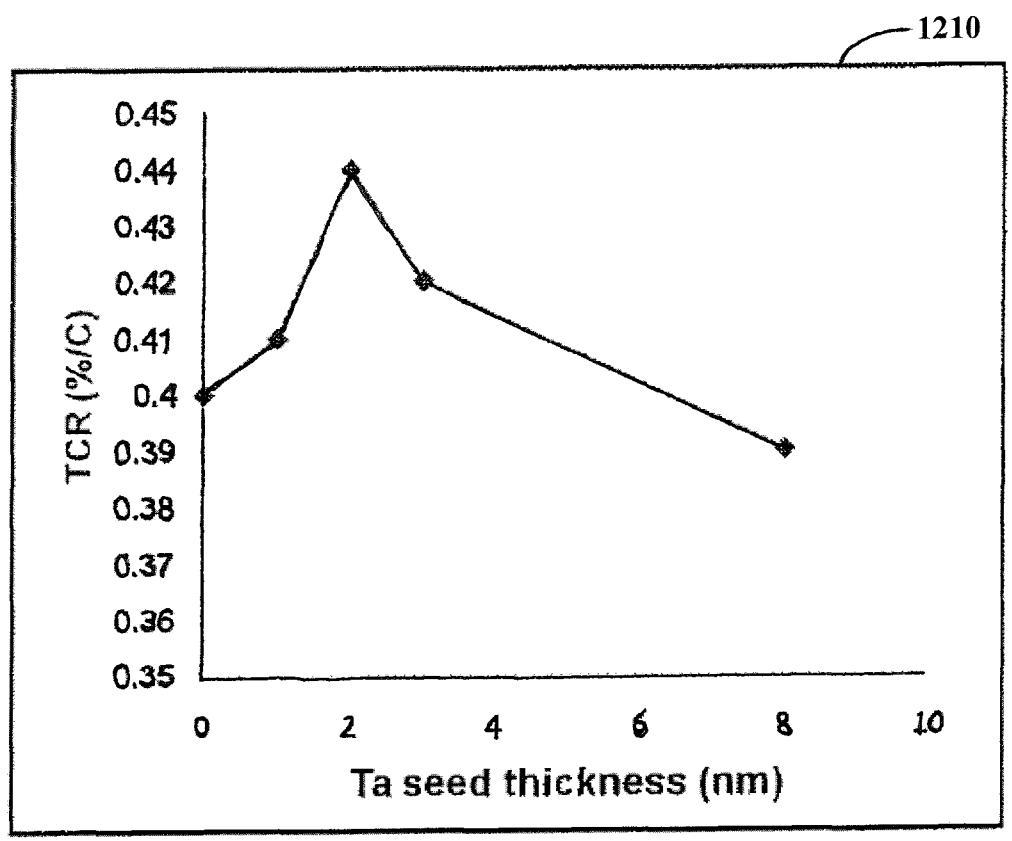
FIG. 12 shows dependence of the TCR of Ni films upon the thickness of Ta seed layers in accordance with various embodiments.

In addition, an increase in the TCR of a trilayer thin film structure can be achieved by enhancing (e.g., optimizing) the thickness of the seed layer. FIG. 12 shows the dependence 1210 of the TCR of the Ni films upon the thickness of the Ta seed layers. The total bilayer thickness (Ni+Ta) was maintained at 45 nm and the preparation temperature was 250° C. An enhanced (e.g., optimized) TCR of ~0.43%/° C. was achieved with a 2 nm Ta seed layer. This large TCR represents an approximate 0.43% increase over the TCR of the Ni single layer film prepared at room temperature.

Depending on the materials of the conductive layers and total thickness, the TCR of the trilayer film is from about 0.2 to about 0.5%/° C., with sheet resistance from about 3 to about 8 ohms. The optimized seed layer thicknesses are from about 1 to about 5 nm depending upon the seed layer materials and conductive layer materials. The optimized seed layer thicknesses are applicable to the trilayer structure where both the underlayer seed and the overlayer (the layer over the conducting layer) utilize the identical thickness. Furthermore, the underlayer seed and the overlayer can be used with different thicknesses to provide the specified sheet resistance for device applications. Seed layer thicknesses are subject to optimization to achieve the largest TCR gain.

Other processing parameters, including deposition rate and process gas flow, are also factors that can be optimized to achieve larger TCR. Various fabrication methods are contemplated, including sputtering, other physical vapor deposition processes including thermal evaporation and molecular beam epitaxy, and chemical vapor deposition, for example.

It is to be understood that even though numerous characteristics and advantages of various embodiments disclosed herein have been set forth in the foregoing description, together with details of the structure and function of various embodiments, this detailed description is illustrative only, and changes may be made in detail, especially in matters of structure and arrangements of parts within the principles of the presently disclosed subject matter to the full extent indicated by the broad general meaning of the terms in which the appended claims are expressed.

What is claimed is:

1. An apparatus, comprising:
 a head transducer; and
 a resistive temperature sensor provided at a close point within the head transducer and configured to sense for one or both of head-media contact and thermal asperities, the sensor comprising:
 a first layer comprising a conductive material and having a temperature coefficient of resistance; and
 a second layer comprising at least one of a specular layer and a seed layer.

2. The apparatus of claim 1, wherein the conductive material comprises Cu, Co, Ni, Ru, Pt, Au, Fe, or $Ni_XFe_{1-X}$, or their alloys.

3. The apparatus of claim 1, wherein the sensor comprises a cap layer on the first layer, the cap layer comprising Ta, Ru, Cr, NiCr, or NiRu, or their alloys.

4. The apparatus of claim 1, wherein the first layer has a thickness approximately equal to or less than a mean-free-path of an electron in the conductive material of the first layer.

5. The apparatus of claim 1, wherein the second layer comprises the specular layer.

6. The apparatus of claim 5, wherein the specular layer comprises an insulator layer.

7. The apparatus of claim 6, wherein the insulator layer comprises $SiO_2$, NiO, $Al_2O_3$, $FeO_x$, $HfO_2$, $Y_2O_3$, MgO, $TiO_x$, $CuO_x$, $SrTiO_3$, or ZrO.

8. The apparatus of claim 5, wherein the specular layer comprises a metal layer.

9. The apparatus of claim 8, wherein the metal layer comprises Au, Ag, Cu, Pt, or Ru, or their alloys.

10. The apparatus of claim 5, further comprising at least one flash metal layer between the first layer and the specular layer.

11. The apparatus of claim 10, wherein the flash layer comprises Cu, Ag, or Au, or their alloys.

12. The apparatus of claim 5, wherein the sensor comprises a plurality of the first layers and a plurality of the specular layers.

13. The apparatus of claim 5, wherein the specular layer has a specularity of about 0.2 to about 0.8.

14. The apparatus of claim 1, wherein the second layer comprises the seed layer.

15. The apparatus of claim 14, wherein the seed layer comprises Ta, Ru, Cr, NiCr, or NiRu, or their alloys.

16. A method, comprising:
   fabricating, at a close point within a head transducer, a resistive temperature sensor configured for sensing one or both of head-media contact and thermal asperities, the fabricating comprising:
      forming, on the head transducer, a first layer comprising a conductive material having a temperature coefficient of resistance; and
      forming, on the head transducer, a second layer comprising at least one of a specular layer and a seed layer.

17. The method of claim 16, wherein forming the first layer comprises forming the first layer to a thickness approximately equal to or less than a mean-free-path of an electron in the conductive material of the first layer.

18. The method of claim 16, wherein the conductive material comprises Cu, Co, Ni, Ru, Pt, Au, Fe, or $Ni_xFe_{1-x}$, or their alloys.

19. The method of claim 16, comprising forming a cap layer over the first layer, the cap layer comprising Ta, Ru, Cr, NiCr, or NiRu, or their alloys.

20. The method of claim 16, wherein forming the second layer comprises forming the specular layer comprising $SiO_2$, NiO, $Al_2O_3$, $FeO_x$, $HfO_2$, $Y_2O_3$, MgO, $TiO_x$, $CuO_x$, $SrTiO_3$, or ZrO.

21. The method of claim 16, wherein forming the second layer comprises forming the specular layer comprising Au, Ag, Cu, Pt, or Ru, or their alloys.

22. The method of claim 16, comprising forming a flash metal layer between the first layer and the second layer, wherein:
   forming the second layer comprises forming the specular layer; and
   forming the flash metal layer comprises forming a flash material comprising Cu, Ag, or Au, or their alloys.

23. The method of claim 16, wherein forming the second layer comprises forming the seed layer comprising Ta, Ru, Cr, NiCr, or NiRu, or their alloys.

24. The method of claim 16, wherein:
   forming the second layer comprises forming the seed layer; and
   forming the seed and conducting layers is performed in situ in a high vacuum environment.

25. The method of claim 16, wherein:
   forming the second layer comprises forming the seed layer; and
   forming the seed and conducting layers is performed at an elevated temperature relative to room temperature.

* * * * *